United States Patent [19]

Hvezda et al.

[11] Patent Number: 4,810,956

[45] Date of Patent: Mar. 7, 1989

[54] MOUNTING BRACKET FOR TEST PROBES

[75] Inventors: Jaroslav M. Hvezda, Nepean; Richard J. Middlehurst, Kanata, both of Canada

[73] Assignee: Northern Telecom Limited, Montreal, Canada

[21] Appl. No.: 136,040

[22] Filed: Dec. 21, 1987

[51] Int. Cl.[4] ............................................. G01R 31/02
[52] U.S. Cl. ............................ 324/158 P; 324/73 PC; 324/158 F
[58] Field of Search ............... 324/158 P, 158 F, 72.5, 324/73 PC

[56] References Cited

U.S. PATENT DOCUMENTS

| | | | |
|---|---|---|---|
| 4,227,149 | 10/1980 | Faure et al. | 324/158 P |
| 4,267,506 | 5/1981 | Shiell | 324/158 P |
| 4,362,991 | 12/1982 | Carbine | 324/158 |

Primary Examiner—Ernest F. Karlsen
Attorney, Agent, or Firm—Robert C. Hogeboom

[57] ABSTRACT

A mounting bracket for test probes for use in testing electronic circuitry. By placing a printed circuit board (PCB) from a shelf of interconnected PCBs in an extender card connected to the shelf, a mounting bracket may be attached to the extender card. The mounting bracket allows test probe assemblies to be placed anywhere over the PCB being tested. A system is thereby created wherein any point to be tested on the PCB may be readily accessed. The system may be used to test PCBs employing flat-pack, dual in-line, or surface mount integrated circuit (IC) technology. The mounting bracket is useful for testing PCBs in situations where the PCB must be operating as part of a larger, combined circuitry such as used in the telecommunications industry.

4 Claims, 5 Drawing Sheets

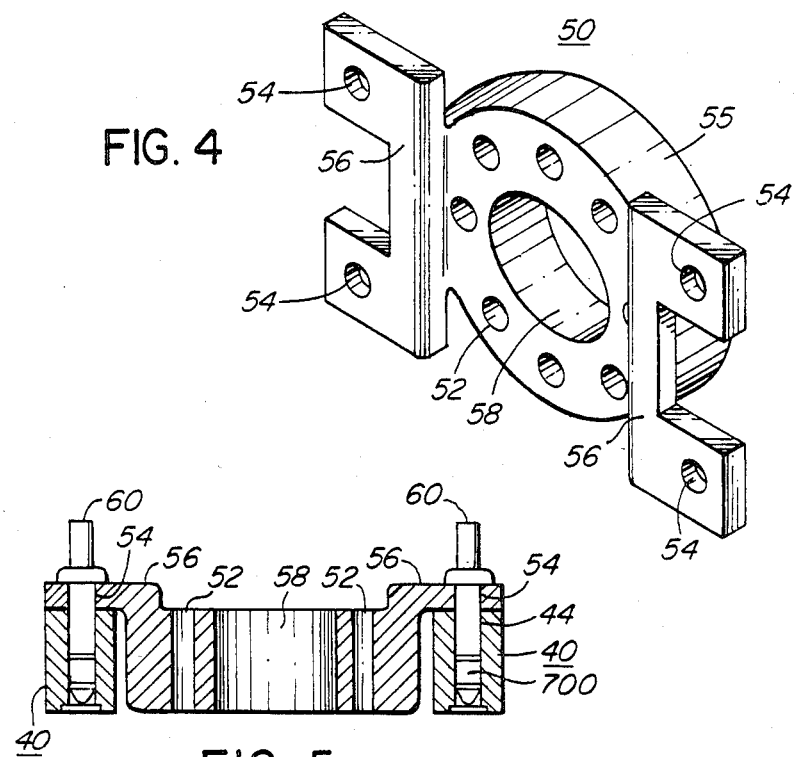
FIG. 4
FIG. 5
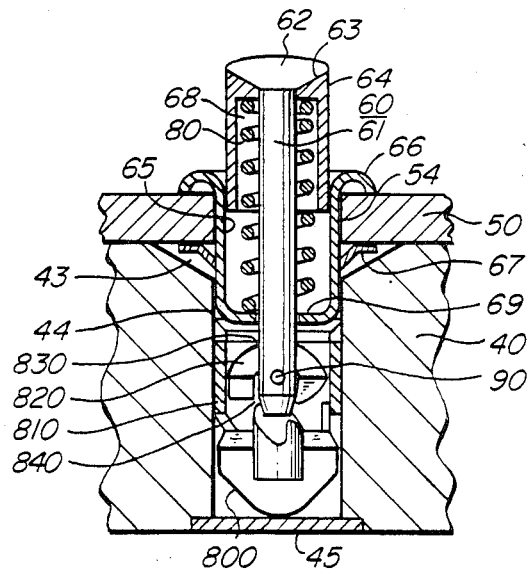
FIG. 6

MOUNTING BRACKET FOR TEST PROBES

FIELD OF THE INVENTION

This invention relates generally to mounting brackets. More particularly the invention relates to mounting brackets for test probes for use in testing printed circuit boards.

BACKGROUND OF THE INVENTION

Many test systems exist for the testing of printed circuit boards during manufacturing. These systems generally involve some form of a "bed of nails" wherein a series of metallic pins make contact with points on a PCB. These systems may automatically test resistance, capacitance etc. or may inject signals to test for shorted or unconnected electrical paths.

However, "in-house" testing, or testing during manufacturing, is only one part of PCB testing. Testing of PCBs is also required during research and development, and often after the product has been sold and installed in customer premises. In such situations a portable and easily alterable in-circuit test system is required. Typically testing in such situations employs oscilloscopes, logic analyzers, and/or data scopes. These instruments are carried to the laboratory or into the field and are connected to the circuit board via test clips connected to wires attached to the test equipment. Such a technique has worked well on simple PCBs involving very few integrated circuits, and wherein the ICs have been in the form of dual in-line packages such as Intel's part #74LS74. A dual in-line package, due to its construction, allows the test clips attached to the test equipment to be easily connected. However, current technology is leading to PCBs having a high density of ICs. These ICs may be in the form of dual in-line, flat pack, or surface mount technologies. In the case of dual in-line packages, it is very often difficult to attach all the test clips required to perform a reasonable circuit test due to the reduced open board area. The use of flat pack or surface mount technologies makes it difficult, if not impossible, to connect test clips to their interconnection leads. One problem of testing numerous points on a PCB, as may be required, is the resulting congestion of test probes and their interconnection leads making changes difficult and entangling equipment and interconnection leads.

Different systems have been proposed to overcome the problems of testing these new, high density circuit packs. One such system is described in U.S. Pat. No. 4,362,991 issued Dec. 7, 1982 in the name of Joseph C. Carbine entitled "Integrated Circuit Test Probe Assembly". In that patent a system is described where any IC on a PCB may be tested. However, the system of that patent is limited to the testing of PCBs employing flat pack IC packages. Additionally, the system of that patent only allows the testing of a single IC at one time; it does not allow for the testing of several ICs or other components, such as resistors or capacitors, or signal test points that may be part of the design of the PCB.

SUMMARY OF THE INVENTION

The present invention is a unique mounting bracket for test probes. The present invention may be used as a test system which allows for the testing of a PCB while it is operating as part of a larger circuit. The system is designed such that it is portable and readily assembled. The present invention allows for the testing of virtually any component or signal on a PCB. To test a PCB, the PCB is removed temporarily from its circuit and placed in an extender unit which allows all points on the PCB to be accessed. The extender unit supports the PCB outside of a shelf which may contain other PCBs, constituting part of the same overall circuit, while allowing the PCB to be electrically connected to the circuit as it would in normal operation. This allows one to test a PCB which otherwise would not be accessible due to the presence of other PCBs in the shelf. The mounting brackets of the present invention are then slidably attached to the rails of the extender. Test probe assemblies such as those described in more detail in copending application Ser. No. 127,312, filed Dec. 2, 1987 in the name of J. Hvezda et al are then placed in the mounting brackets. The test probe assemblies may then be adjusted to access any point on the PCB. If it is desired to test a particular IC a "focussing" member may be used. A focussing member may be a type of mounting bracket which surrounds an IC allowing test probe assemblies to be easily positioned in contact with an IC. Generally the focussing member is supported by two mounting brackets. The focussing member is quickly attached to the mounting brackets by a combination push button/cam lock fastener. Thus a test system is created which is easily and quickly assembled and may be readily altered to test other portions of the PCB. By using the test probe assemblies described in the aforementioned copending application the congestion of test clips and test wires is avoided.

Stated in other terms, the present invention is a mounting bracket for test probes used for probing selected points of an electronic circuit contained on an interconnection medium (for instance, a printed circuit board), the mounting bracket comprising: at least one mounting means for mounting the mounting bracket; and at least one support means for supporting at least one of the test probes.

Stated in yet other terms, the present invention is a mounting bracket for test probes, the mounting bracket comprising: a first substantially rectangular member with a plurality of openings substantially equidistantly spaced longitudinally; the first substantially rectangular member having first and second substantially rectangular arms mounted perpendicularly thereto and at opposite ends thereof; each of the first and second substantially rectangular arms having: a rectangular channel extending longitudinally therethrough so that the mounting bracket may be engaged with lateral members of a support for the interconnection medium; a threaded hole passing perpendicularly through the substantially rectangular arm and extending through to said channel; an a thumbscrew for engagement with the hole to act as a locking mechanism to provide a frictional force against the support such that the mounting bracket is held substantially in position.

BRIEF DESCRIPTION OF THE DRAWINGS

Embodiments of the invention will now be described, by way of example, with reference to the accompanying drawings.

FIG. 4 is a simplified perspective view of one type of focussing member;

FIG. 5 is a detailed side elevation view of the focussing member depicted in FIG. 4 showing the interconnection between the mounting bracket and the focussing member;

FIG. 6 is a side cross-sectional view of a push button stud and cam assembly arrangement as used in attaching the focussing member to the mounting bracket;

DETAILED DESCRIPTION OF THE PREFERRED EMBODIMENTS

Figure 1:
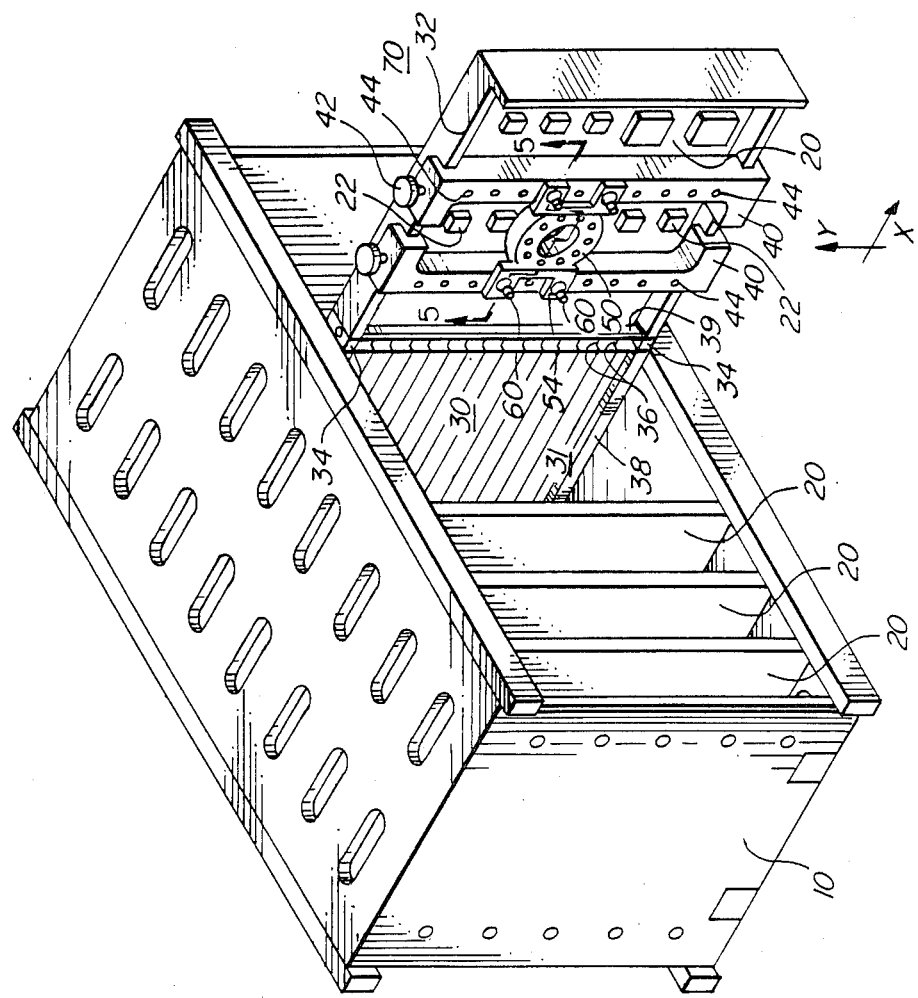
FIG. 1 is a simplified perspective view of a shelf containing several printed circuit boards. Depicted, in particular, is an embodiment of the mounting bracket for test probes constructed according to the teachings of the present invention.

FIG. 1 depicts a typical printed circuit board arrangement in which several PCBs 20 are contained and interconnected within a shelf 10. Shelf 10 itself may be part of an even larger circuit. Of particular interest in FIG. 1 is the test set up 70 which incorporates a PCB 20 inserted into an extender card 30. Extender card 30 is used to support PCB 20 outside of shelf 10 while maintaining electrical contact between PCB 20 and shelf 10. Such an arrangement allows PCB 20 to be examined or tested on both sides while PCB 20 is operating as a part of shelf 10 circuitry.

Briefly, extender card 30 consists of a PCB 31 having electrically conductive tracks 38 extending from edge 34 of PCB 31 to the back panel (not shown) of shelf 10. Tracks 38 are individually connected to wires 36 which span across an opening from PCB 31 to connector 39. Connector 39 is hingedly connected to PCB 31 and is provided to allow PC 20 to be moved while remaining electrically connected to shelf 10. PCB 20 is physically supported by rails 32 of extender card 30.

Attached to rails 32 are two mounting brackets 40. Mounting brackets 40 are used to support test probe assemblies used in the testing of PCB 20. Mounting brackets 40 are slidably mounted on rails 32 so that they may be positioned anywhere in the X-axis. Mounting brackets 40 are also easily removable. A more detailed description of mounting bracket 40 will follow. Bridged between the two mounting brackets 40 is an example of a focussing member 50 which is used to aid in positioning test probes onto an integrated circuit component 22.

Figure 2:
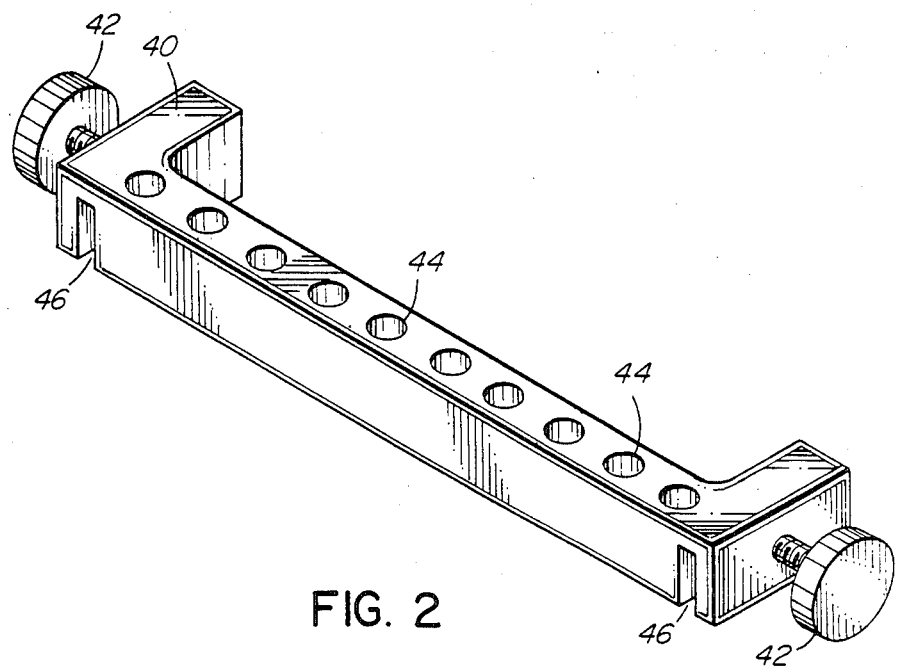
FIG. 2 is a simplified perspective view of a mounting bracket constructed according to the teachings of the present invenion.
Figure 3:
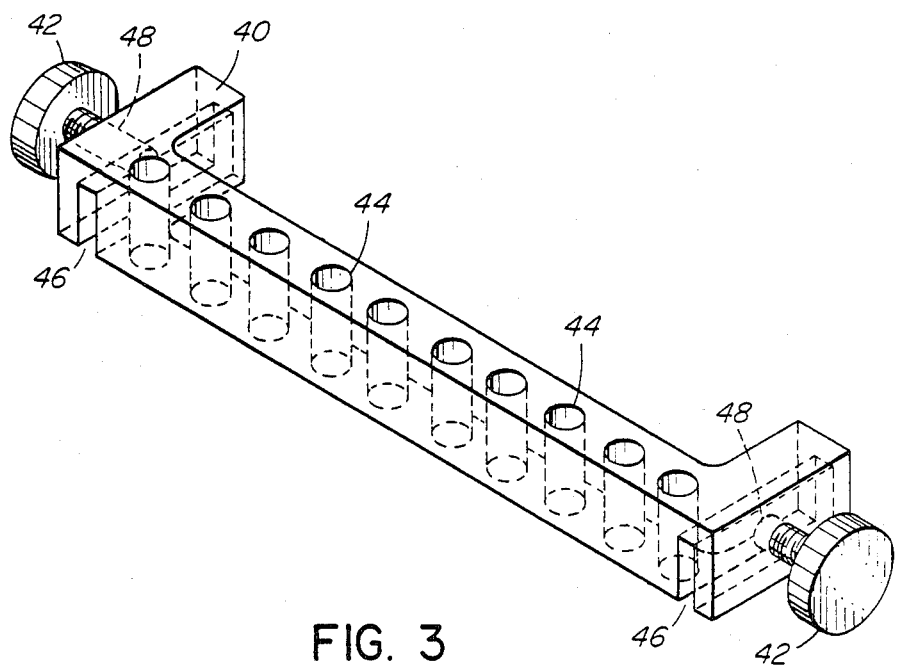
FIG. 3 is a more detailed perspective view of the mounting bracket depicted in FIG. 2.

FIGS. 2 and 3 show mounting bracket 40 in more detail. Mounting bracket 40 has two rectangular channels 46 which are provided to allow mounting bracket 40 to be seated on extender card rails 32. Thumbscrews 42 are threaded into bores 48 which pass through the ends of mounting bracket 40 and extend through to rectangular channel 46. Mounting bracket 40 can be positioned anywhere in the X-axis along extender card rails 32 by manually sliding mounting bracket 40 back and forth. Mounting bracket 40 can be locked in a given position by turning thumbscrews 42 clockwise so that they engage extender card rails 32 thus producing a frictional locking force. To allow mounting bracket 40 to be repositioned, thumbscrews 42 are turned counter-clockwise thus removing the frictional force. Openings 44 are provided to allow the insertion of cam-lock fasteners.

FIG. 4 is a perspective view of a focussing member 50. Focussing member 50 comprises an approximately donut shaped ring 55 having a circular opening 58. Circular opening 58 is provided to allow access to a particular integrated circuit 22 (as shown in FIG. 1). Donut ring 55 has within its body several openings 52 to accept cam-lock fasteners such as described in U.S. Pat. No. 3,152,822, in the name of E. G. Griffiths entitled "Push Button Fastener". Molded to donut ring 55 are mounting members 56 which serve to attach focussing member 50 to mounting brackets 40. Attachment is achieved by the use of push button studs 60 (see FIG. 5) such as SPAE-NAUR's part #110-001 or similar article in receptacles 54.

FIG. 5 is a side elevation view of focussing member 50 showing its attachment to mounting bracket 40. Cam-lock fastener 700 interacts with push button stud assembly 60 to hold focussing member 50 in position. Focussing member 50 may be placed anywhere in the Y-axis by positioning receptacles 54 over openings 44. Push button stud assemblies 60 are then pressed once at each receptacle 54 to engage push button stud assemblies 60 with cam lock fasteners 700 to lock each corner of focussing member 50 in place. To move focussing member 50, each push button stud assembly 60 is pressed once again, which will disengage the stud 60 from cam lock fastener 700.

Figure 7:
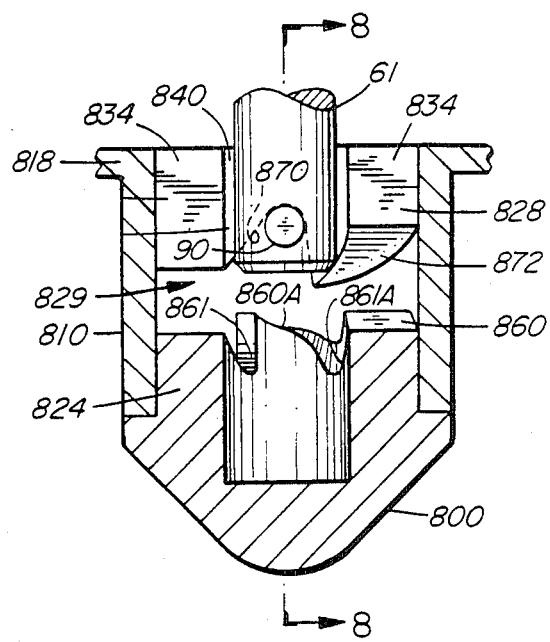
FIG. 7 is a more detailed cross-sectional view of the cam assembly depicted in FIG. 6.
Figure 8:
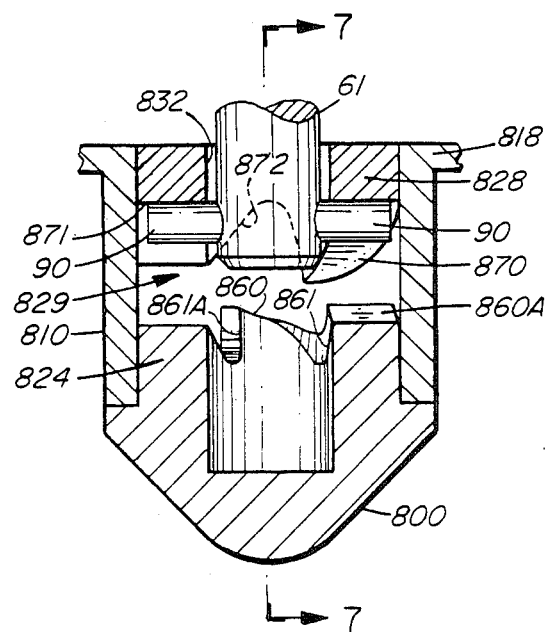
FIG. 8 is a further side cross-sectional view of the cam arrangement depicted in FIG. 7 taken along section lines 8—8.

FIG. 6 depicts a push button stud 60 and cam assembly 800 as described in aforementioned U.S. Pat. No. 3,152,822. It is shown here for ease of description of a particular embodiment of the present invention. In FIG. 6 the cam assembly 800 is free to rotate. Push button stud assembly 60 comprises a push button stud 61 with head 62 seated on tapered seat 63 at the upper end of sleeve 64 which is slidable in fixed cup 65. Fixed cup 65 is fitted into receptacle 54 of focussing member 50 and secured by lock-washer 67, which will prevent upward movement, and lip 66 of fixed cup 65, which prevents downward movement. Spring 80 is held in position at one end by shoulder 68 of push button stud assembly 60, and at the other end by base 69 of fixed cup 65. A cross-pin 90 is present at the lower end of push button stud 61. Cam assembly 800 is inserted in opening 44 of mounting bracket 40. Opening 44 is countersunk at 43 to allow space for lock washer 67 so that focussing member 50 may sit flush with mounting bracket 40. At the bottom of opening 44 is a base wall 45. Base wall 45 supports cam assembly 800 which includes lower part 810 and upper part 820 having central opening 840 shaped to pass cross-pin 90 therethrough FIGS. 7 and 8 show a more detailed side cross-sectional view of the cam assembly. As soon as stud 61 has been inserted into central opening 832, cross-pin 90 is automatically aligned with slot 834 in circular detent cam 828. Stud 61, and cross-pin 90, are further inserted into central opening 832 by pressing on push button stud head 62, compressing spring 80, thus placing cross-pin 90 in passageway 829. Cross-pin 90 acts as the cam follower which tracks the surface contours of cams 828 and circular indexing cam 824. As cross-pin 90 enters passageway 829 it first strikes inclined surface 860 on indexing cam 824 which then turns in a circular path until cross-pin 90 stops its motion by coming in contact with detent 861. Push button head 62 is then released, allowing spring 80 to return to its rest position. As spring 80 begins its return, stud 61 and cross-pin 90 move in an upwards direction. Cross-pin 90 strikes inclined surface 870 on detent cam 828, under which surface cross-pin 90 has become aligned. Inclined surface 870 acting against cross-pin 90 causes cam 828 to rotate, continuing in the same direction as initiated by inclined section 860, until cross-pin 90 comes in contact with detent 871. The fastener is now locked in position.

To unlock the fastener the push button head 62 is again pressed, thus moving cross-pin 90 out of its locked position causing it to strike inclined surface 860A on cam 824 which causes cam 824 to rotate in the same direction as before until cross-pin 90 comes in contact with detent 861A. At this point push button head 62 is released causing spring 80 to return to its rest position and thus moving stud 61 and cross-pin 90 in an upwards direction. Cross-pin 90 then comes in contact with inclined surface 872 on detent cam 828 which will rotate aligning cross-pin 90 with slot 834. At this point stud assembly 60 may be removed from fastener 700.

Figure 9:
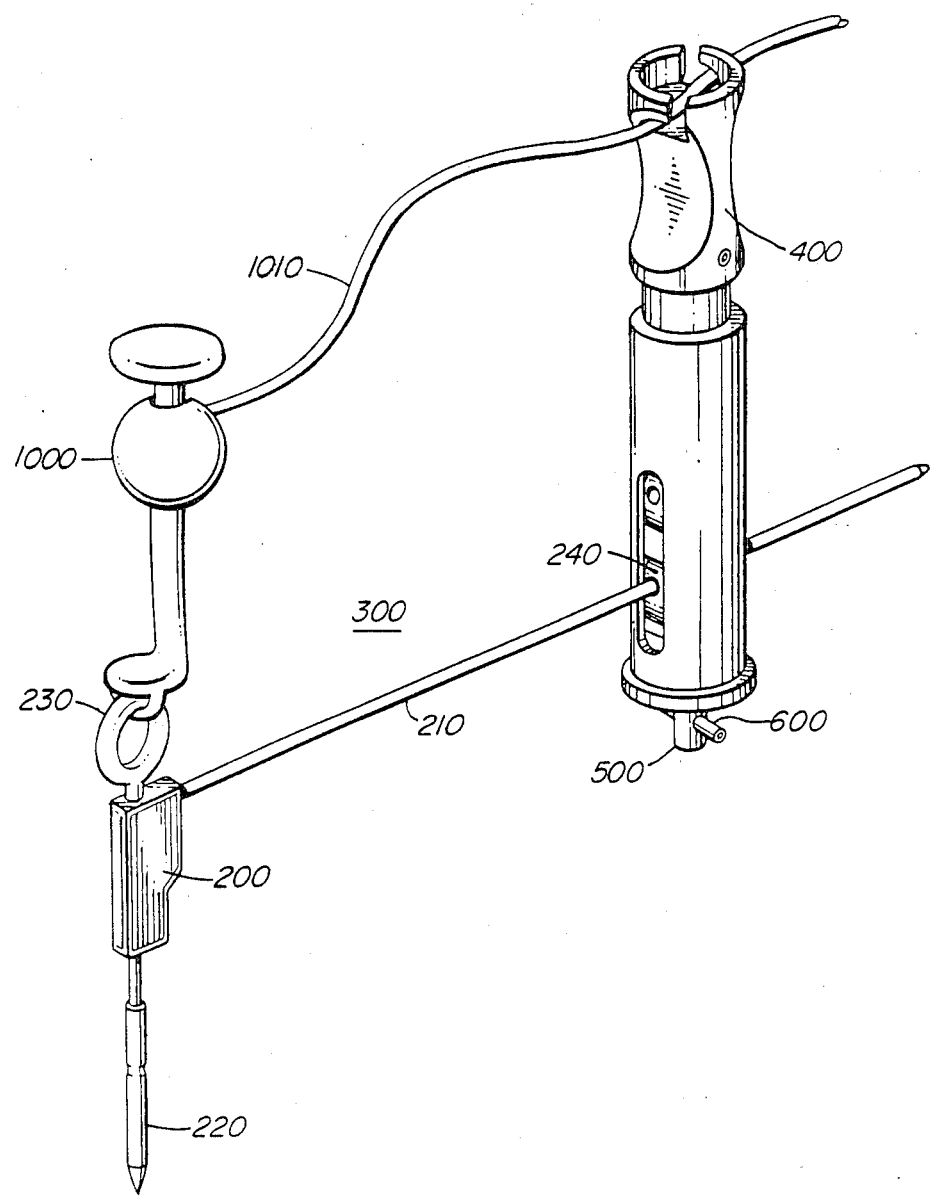
FIG. 9 is a simplified perspective view of an adjustable quick mount test probe assembly used in a particular embodiment of the present invention.

FIG. 9 shows a perspective view of a quick mount test probe assembly 300 and a test clip 1000 with associated test lead 1010 (connected to a test equipment unit not shown). FIG. 9 is reproduced from aforementioned copending application Ser. No. 127,312, and is provided here as an aid to understanding a particular embodiment of the present invention. Quick mount test probe assembly 300 comprises a test probe support 200 which is movable in the X-axis by sliding arm 210 in and out of test probe assembly 300, and movable in the Y-axis by moving arm 210 up or down, thus rotating disk 240 within test probe assembly 300. Test probe support 200 comprises a replaceable test probe tip 220, which is used to make electrical contact with the component under test, and ring 230, which is provided to allow a test clip 1000 to be electrically connected. It should be noted that test lead 1010 can be neatly dressed within push button 400 of test probe assembly 300 to relieve stress on test probe tip 220. Push button 400 is used to engage or disengage stud 500, to which cross-pin 600 is attached, with cam lock fastener 700 in a similar manner as described above for the push button stud assembly 60.

Although a particular style of test probe assembly and fastener has been described, it should be noted that most any type of test probe assembly and support means may be used in conjunction with the mounting bracket and focussing members. It is also not the intention of this document to limit the shape of the mounting brackets. Any shape of cross-member may be employed as long as the members may allow adjustable access to the printed circuit board under test.

It can be realized that such a test system can also be used for testing a single circuit pack which is not part of a larger system. All that would be required is a support for the PCB designed such that the mounting brackets may be affixed thereto.

What is claimed is:

1. A mounting bracket for test probes, said mounting bracket comprising:
    a first substantially rectangular member with a plurality of openings substantially equidistantly spaced longitudinally;
    said first substantially rectangular member having first and second substantially rectangular arms mounted perpendicularly thereto and at opposite ends thereof;
    each of said first and second substantially rectangular arms having:
    a rectangular channel extending longitudinally therethrough so that said mounting bracket may be engaged with lateral members of a support for said interconnection member;
    a threaded hole passing perpendicularly through said substantially rectangular arm and extending through to said channel; and
    a thumbscrew for engagement with said hole to act as a locking mechanism to provide a frictional force against said support such that said mounting bracket is held substantially in position.

2. The mounting bracket for test probes as claimed in claim 1 wherein said interconnection medium is a printed circuit board.

3. The mounting bracket for test probes as claimed in claim 2 wherein said openings contain cam lock fasteners for supporting said test probe assemblies.

4. The mounting bracket for test probes as claimed in claim 3 wherein said plurality of openings within said substantially rectangular member is 10 to 30.

* * * * *